United States Patent [19]

Bacrania

[11] Patent Number: 4,897,567

[45] Date of Patent: Jan. 30, 1990

[54] FAST LEVEL TRANSLATOR CIRCUIT

[75] Inventor: Kantilal Bacrania, Palm Bay, Fla.

[73] Assignee: Harris Corporation, Melbourne, Fla.

[21] Appl. No.: 257,015

[22] Filed: Oct. 13, 1988

[51] Int. Cl.[4] .................. H03K 19/092; H03K 19/017; H03K 3/26

[52] U.S. Cl. .................................... 307/475; 307/448; 307/451; 307/279; 307/530

[58] Field of Search ............... 307/443, 448, 451, 475, 307/279, 530

[56] References Cited

U.S. PATENT DOCUMENTS

| 1,677,321 | 6/1987  | Bacrania   | 307/475 |
| 4,301,383 | 11/1981 | Taylor     | 307/585 |
| 4,357,791 | 3/1984  | Gingerich  | 365/230 |
| 4,380,710 | 4/1983  | Cohen      | 307/475 |
| 4,446,444 | 5/1984  | Patterson  | 330/264 |
| 4,450,371 | 5/1984  | Bismarck   | 307/475 |
| 4,717,847 | 1/1988  | Nolan      | 307/451 |
| 4,785,206 | 11/1988 | Hoshi      | 307/279 |

Primary Examiner—Stanley D. Miller
Assistant Examiner—Margaret Rose Wambach
Attorney, Agent, or Firm—Barnes & Thornburg

[57] ABSTRACT

A level translator having a pair of cross-coupled pull-down field effect transistors, a pair of pull-up transistors, and a pair of additinal pull-down transistors wherein the additional pull-down transistors are operable to be on to initially pull down the respective node and the first pair of pull down transistors turn on to finish the pull down. The additional pull-down transistors became ineffective while the first pair of pull-down transistors are turned on hard.

6 Claims, 2 Drawing Sheets

FAST LEVEL TRANSLATOR CIRCUIT

BACKGROUND AND SUMMARY OF THE INVENTION

The present invention relates generally to level shifters or translator circuits and more specifically to a level translator circuit which converts a single polarity signal into a dual polarity peak-to-peak signal.

A typical example of prior art interface or buffer circuits are U.S. Pat. Nos. 4,677,321 to Bacrania and 4,380,710 to Cohen et al., both assigned to Harris Corporation. These circuits are for converting single polarity TTL input signals to single polarity larger value CMOS level signals. Both circuits generally include differential inputs with a current mirror driving the output inverters. Techniques are included to increase the speed of operation as well as to compensate for manufacturing variances.

Another interface or level shifted circuit with speed-up operation is described in U.S. Pat. No. 4,450,371 to Bismarck. In this circuit, large capacity or low resistance field effect transistors P1A and P2A are provided and responsive to output level transitions to pull the respective node high to VDD. Once the transition is substantially effected, P1A or P2A are turned off leaving the smaller devices P1 or P2 on. The size of the devices P1A and P2A is necessary because they must overcome the currents of N1 and N2 previously tied to the node. Because of the use of the output logic, there is a substantial delay in the pull up of the node as illustrated by the drawings in FIG. 3. The number of devices in the output circuit necessarily increases the area required for the device, as well as adding delay of operation.

Thus, it is an object of the present invention to provide a level translator circuit which takes a single polarity signal and converts it into a bipolarity signal.

Another object of the present invention is to provide a faster level translator.

A still further object of the present invention is to provide a fast level translator with low power dissipation.

An even further object of the present invention is to provide a fast level translator with a minimum number of devices and thus reduce area.

A still even further object of the present invention is to provide a fast level translator without the use of passive components such as resistors.

A still even further object of the present invention is to provide a fast level translator which allows adjustment of the rise and fall times by adjusting the minimum number of device characteristics.

An even further object of the present invention is to provide a fast level translator which draws power only during switching transitions.

These and other objects of the invention are attained by providing a translating circuit between an input inverting circuit and an output circuit having a first and second field effect transistor with their source-drain paths connected between a first voltage terminal and first and second node, respectively, and their gates cross-coupled to the second and first nodes, respectively. Third and fourth field effect transistors have their source-drain paths connected between a second voltage terminal and the respective first and second nodes and their gates connected to the output and input, respectively, of the input inverter. Fifth and sixth field effect transistors have their source-drain paths connected between a third voltage terminal and a respective first and second nodes, and their gates connected one to the input and one to the output of the input inverter such that the third and sixth transistors are on together and the fourth and fifth transistors are on together. The output circuitry is connected to the second node. The fifth and sixth transistors pull their respective first and second nodes to the voltage at the third voltage terminal quicker than the contribution produced by the first and second transistors, respectively.

Other objects, advantages and novel features of the present invention will become apparent from the following detailed description of the invention when considered in conjunction with the accompanying drawings.

DETAILED DESCRIPTION OF THE DRAWINGS

Figure 1:
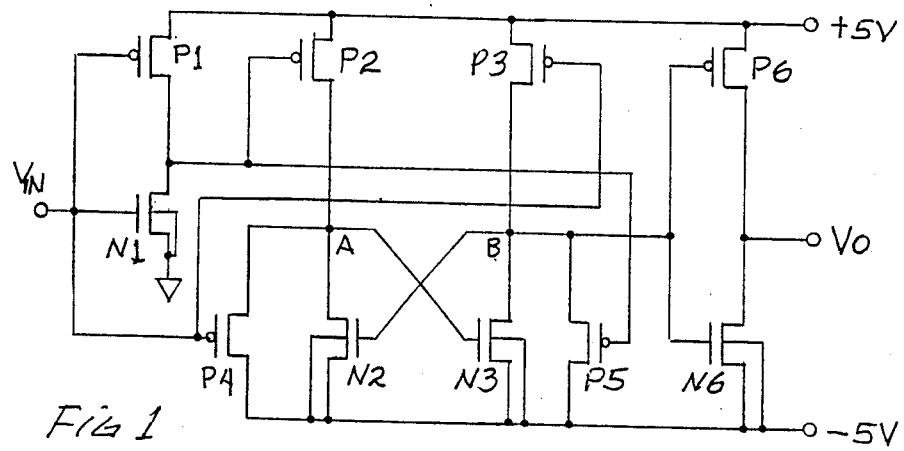
FIG. 1 is a schematic of a first preferred embodiment of a level translator circuit incorporating the principles of the present invention.

A level translating circuit is shown in FIG. 1 as including an input inverter including complementary insulated gate field effect transistors P1 and N1 receiving at its input the input signal V-IN and an output stage illustrated as an inverter and including complementary field effect transistors P6 and N6 having an output VO. It should be noted that the present circuit was specifically designed for converting single polarity input signals, for example between 0 and +5, to dual polarity output signals of between ±5 volts. The concepts and designs to be explained may be used wherein the output voltage has a greater value than the input voltage to go from single polarity to dual polarity as well as the concept being applicable to the output voltage being single polarity of greater differential value than the differential input values.

For the present exemplary embodiment, the input inverter has its source-drain path connected between +5 volts and ground whereas the output circuit has its source-drain path connected between ±5 volts.

The translator circuit includes field effect transistors N2 and N3 having their source-drain paths connected between the −5 volt terminal and nodes A and B respectively. The gates of transistors N2 and N3 are cross-coupled to nodes B and A respectively. Field effect transistors P2 and P3 have their source-drain paths connected between the +5 volt terminal and nodes A and B respectively and their gates connected to the output and input of the input inverter respectively. The field effect transistors P4 and P5 have their source-drain paths connected between the −5 volt terminal and nodes A and B respectively and their gates connected to the input and output of the input inverter P1-N1 respectively.

The node B is connected as the input to the output circuitry P6-N6. Although the output stage is shown as including a single complementary field effect transistor inverter, a second inverter may be placed in cascade so as to provide a non-inverted and inverted output signal. Alternatively, the inverting and non-inverting outputs can be generated from nodes B and A respectively, using two inverters, one for each node. The bodies of N2 and N3 are connected to the −5 volt terminal to prevent the body-to-source/drain diode from turning on during switching.

The operation will be described with respect to a single transition and it is evident that for the opposite transition the corresponding transistors operate in the reverse manner. Assume that the input V-IN is at a low voltage, for example ground. For this condition the output of the inverter P1-N1 has a high signal, thus transistors P2 and P5 are off and transistor P3 is on drawing the node B to +5 volts minus the voltage drop across P3. Thus, N2 is on causing the voltage in node A to be −5 volts plus the voltage drop across N2 and therefore N3 is off. Although the voltage is at ground on the gate of P4, it is higher than the voltage at node A and therefore P4 is also off. The high voltage on node B is then inverted by the output circuit P6-N6 to provide a low at the output V0.

As the input voltage V-IN goes from a low to a high signal, for example +5 volts, the output of the inverter P1-N1 goes low, turning on transistors P2 and P5. The high input voltage turns off transistor P3 and maintains P4 off. While P2 begins to pull the voltage at node A up from approximately −5 volts, transistor P5 begins to immediately draw the voltage on node B, which is at approximately 5 volts, down. As the voltage at node A becomes positive, N3 turns on adding to the ability of bringing the node B down in combination with the capability of P5. As the voltage on node B diminishes, N2 turns off, and when it becomes negative, P5 is turned off and N3 continues diminishing the voltage on node B, eventually bringing it down to −5 volts plus the voltage drop across N3. The negative voltage on node B is the inverted by the output circuit P6-N6 to provide a high signal at the output V0.

Thus, it can be seen that the transistors P4 and P5 bring the respective nodes A and B down to the appropriate voltage before the action of the cross-coupled transistors N2 and N3 begins to contribute significantly. This substantially increases the speed of switching of the translator circuit. Because of the switching delay through the input inverter P1 and N1 for a high to low transition of the input signal V-IN, P2, P3 and P4 are on simultaneously until the time delay through the input inverter P1-N1 wherein P2 is turned off. The simultaneous activation of P2 and P4 creates a current path between the ±5 volts.

By adjusting the ratios of the devices N2 and N3, the rise and fall times may be adjusted. Varying the length will change the current drive capability of the transistors which will produce the required adjustment.

Figure 2:
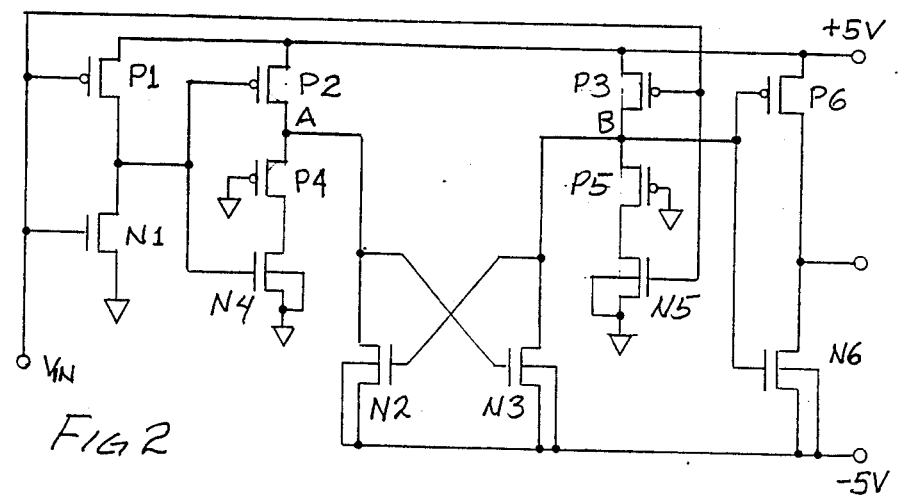
FIG. 2 is a schematic of a second preferred embodiment of a level translator circuit incorporating the principles of the present invention.
Figure 3:
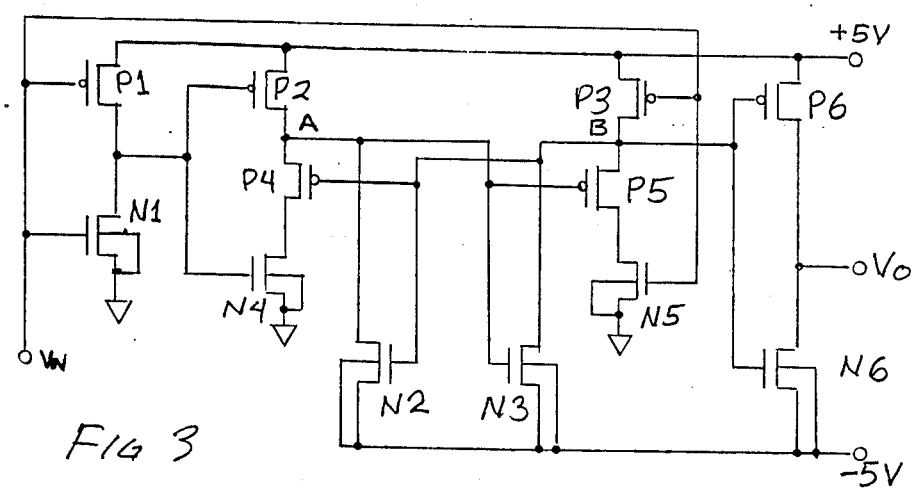
FIG. 3 is a schematic of a third preferred embodiment of a level translator circuit incorporating the principles of the present invention.
Figure 4:
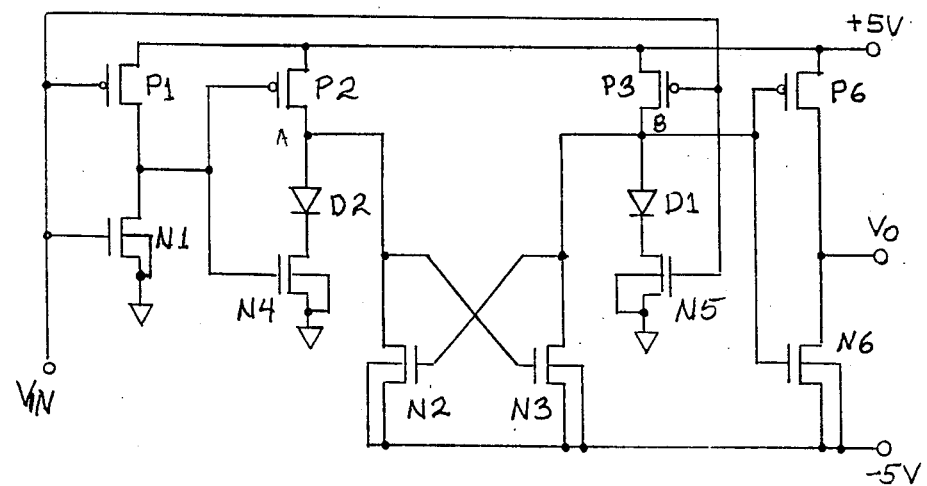
FIG. 4 is a schematic of a fourth preferred embodiment of a level translator circuit incorporating the principles of the present invention.

To eliminate the current path between the ±5 volt supply terminals created by the simultaneous actuation of both fast switching, pull-up, pull-down transistors for a short period of time, a switch may be provided in the pull-down transistor source-drain path. Such a circuit is illustrated in FIGS. 2–4. In FIG. 2, the transistors P4 and P5 have their gates connected to ground and transistors N4 and N5 respectively have their source and drain paths connected in series with the source and drain paths of P4 and P5 respectively. The gates of N4 and N5 are connected to the gates of P2 and P3 respectively. Thus, the signals that turn P2 and P3 on, turn N4 and N5 off. With respect to pulling nodes A and B down to ground before they are pulled down to −5 volts by N2 and N3, transistors N4 and N5 are switched on by the input voltages and the inverter to bring the voltage down to ground. When the voltage at terminals A and B start to become negative, P4 and P5 turn off since their gates are connected to ground and therefore disconnect the pull-down transistors N4 and N5. This prevents them from holding the respective nodes A and B at ground and therefore the transistors N2 and N3 may draw the respective nodes fully to the −5 volts. Thus, transistors P4 and P5 disconnect the respective switching transistors N4 and N5 from the respective node A and B and prevent a current path from being formed at a node due to switching delay.

It should be noted that the stacking order of P4-N4 and P5-N5 may be reversed if the bodies of N4 and N5 are connected to the −5 volt terminal to prevent turning on of the drain/source-body diode during switching. The loading on the input terminal V-IN and the output of the inverter P1-N1 will be reduced since the transistors N4 and N5 have higher gain and therefore can be smaller than P4 and P5.

As a variation on the circuit of FIG. 2, the gates of the disconnect devices P4 and P5 may be connected to the opposite node B and A respectively as illustrated in FIG. 3. Thus, the voltage on the gates of P4 and P5 is going in the opposite direction of the node on its source-drain path and therefore the devices can be driven heavier. This may further increase the speed of operation of P4 and P5 in bringing the nodes A and B down, or, in the alternative, the devices may be reduced in size and maintain similar speed of operation in reducing the voltage on the respective nodes. As nodes A and B turn positive, the respective devices P5 and P4 are turned off disconnecting the respective pull-down transistors N4 and N5.

As an even further variation on FIGS. 2 and 3, the transistors P4 and P5 may be replaced by diodes D2 and D1 respectively, which become reverse biased when their respective nodes B and A become negative and therefore disconnect the source-drain path of the pull-down transistors N5 and N4 respectively as illustrated in FIG. 4.

Figure 5:
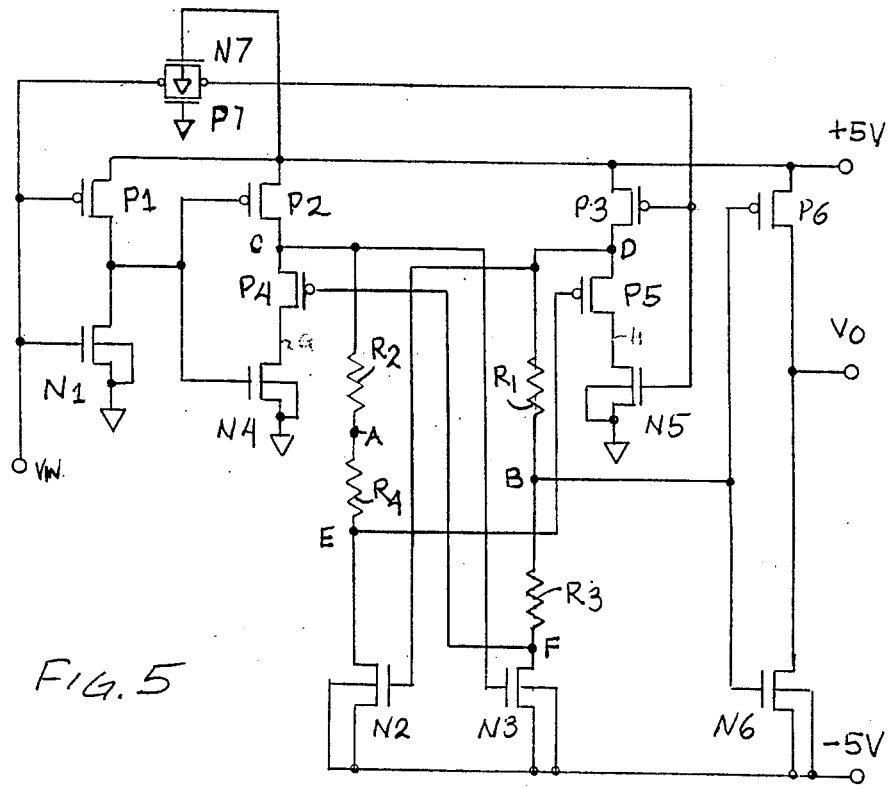
FIG. 5 is a schematic of a fifth preferred embodiment of a level translator circuit incorporating the principles of the present invention.

The circuit of FIG. 4 may be modified to provide the ability of setting the minimum impedance level during switching. As illustrated in FIG. 5, a voltage divider is inserted at the nodes A and B. Resistors R1 and R3 form a voltage divider having the node B at its center connected as the input to the output circuit N6 and P6, with a first end at node D connected between the pull-up device P3 and the pull-down devices P5-N5 and a second end of the divider at terminal F being connected to the source-drain path of N3. The gate of N2 is connected to the node D. A second voltage divider R2-R4 has the node A in the center thereof, a first end C connected to the pull-up device P2 and to the pull-down devices P4-N4 and a second end at node E being connected to the pull-down device N2. The gate of N3 is connected to node C.

R2 and R4 set the minimum impedance which P2 and N2 must overcome during switching whereas R1 and R3 set the minimum impedance which P3 and N3 must overcome during switching. If Ron MAX of P2, P3, N2 and N3 are substantially less than R2, R1, R4 and R3, respectively, then the switching times of nodes A and B are primarily set by the time constant of R2, R4, CA (capacitance at node A) and R1, R3, CB (capacitance at node B). Therefore, the level translator switching speed is more independent of the power supply variations than in 15 FIGS. 2-4.

Although the gate of P4 is connected to node F and the gate of P5 is connected to node E, they may be connected to any voltage between the value at nodes D and F and C and E, respectively, in order to switch P4 and P5 off before nodes G and H are pulled below ground.

A transmission gate N7-P7 is added to introduce a delay between the input signal V-IN and the gates of N5 and P3 equivalent to that introduced by the inverter P1-N1. This allows the transistors P2, P3, N4 and N5 to be switched simultaneously.

It should be noted that the voltage divider of resistors R1 through R4 and the delay element N7 and P7 may be applied to FIGS. 1, 2 and 4 as well.

Although the present invention has been described and illustrated in detail, it is to be clearly understood that the same is by way of illustration and example only, and is not to be taken by way of limitation. The conductivity type of the devices can be reversed as well as being formed in silicon or GaAs. The spirit and scope of the present invention are to be limited only by the terms of the appended claims.

What is claimed:

1. A level translator comprising:
    an input inverter means for receiving input signals between a first and second value at its input and providing inverted input signals between a third and fourth value at its output;
    first and second field effect transistors having their source-drain path connected between a first voltage terminal and a respective first and second node and their gates connected to said second and first nodes respectively;
    third and fourth field effect transistors having their source-drain path connected between a second voltage terminal and a respective first and second node and their gates connected to the output and input of said input inverter means respectively;
    fifth and sixth field effect transistors having their source-drain path connected between a third voltage terminal and a respective first and second node and their gates connected one to said input inverter means' input and one to said input inverter means' output so that said third and sixth transistors are on together and said fourth and fifth transistors are on together; and
    output means having an input connected to said second node for providing output signals between a third and fourth value at its output.

2. A level translator according to claim 1, wherein said first and third values are equal, said second value is zero and said fourth value is equal to said second value.

3. A level translator according to claim 2, wherein said second terminal is set at said third value and said first and third voltage terminals are set at a fifth value.

4. A level translator according to claim 1, wherein said first and second transistors are of a channel type complementary to the channel type of said third, fourth, fifth and sixth transistors, and said fifth and sixth transistors' gates are connected to said inverting means' input and output respectively.

5. A level translator according to claim 1, wherein said first, second, fifth and sixth transistors are of a channel type complementary to the channel type of said third and fourth transistors; and said fifth and sixth transistors' gates are connected to said inverter means output and input respectively.

6. A level translator according to claim 1, wherein said output means is an output inverter means and said input and output inverter means includes complementary insulated gate field effect transistors.

* * * * *